(12) United States Patent
Stejskal et al.

(10) Patent No.: US 11,676,795 B2
(45) Date of Patent: Jun. 13, 2023

(54) CHARGED PARTICLE BEAM DEVICE FOR INSPECTION OF A SPECIMEN WITH A PLURALITY OF CHARGED PARTICLE BEAMLETS

(71) Applicant: FEI Company, Hillsboro, OR (US)

(72) Inventors: Pavel Stejskal, Brno (CZ); Bohuslav Seďa, Brno (CZ); Petr Hlavenka, Brno (CZ); Libor Novák, Brno (CZ); Jan Stopka, Brno (CZ)

(73) Assignee: FEI Company, Hillsboro, OR (US)

( * ) Notice: Subject to any disclaimer, the term of this patent is extended or adjusted under 35 U.S.C. 154(b) by 98 days.

(21) Appl. No.: 17/191,022

(22) Filed: Mar. 3, 2021

(65) Prior Publication Data

US 2021/0296088 A1 Sep. 23, 2021

(30) Foreign Application Priority Data

Mar. 19, 2020 (EP) .................................... 20164231

(51) Int. Cl.

| H01J 37/28 | (2006.01) |
| H01J 37/20 | (2006.01) |
| H01J 37/244 | (2006.01) |
| H01J 37/26 | (2006.01) |

(52) U.S. Cl.
CPC .............. *H01J 37/28* (2013.01); *H01J 37/20* (2013.01); *H01J 37/244* (2013.01); *H01J 37/265* (2013.01); *H01J 2237/049* (2013.01); *H01J 2237/2445* (2013.01); *H01J 2237/24475* (2013.01); *H01J 2237/2801* (2013.01)

(58) Field of Classification Search
CPC .......... H01J 37/28; H01J 37/20; H01J 37/244; H01J 37/265; H01J 2237/049; H01J 2237/2445; H01J 2237/24475; H01J 2237/2801; H01J 2237/2807; H01J 2237/2817; H01J 37/21; G01N 23/203; G01N 23/20091; G01N 23/22; G01N 23/2206; G01N 23/2209; G01N 23/2254

See application file for complete search history.

(56) References Cited

U.S. PATENT DOCUMENTS

| 8,907,280 B1 * | 12/2014 | Larson ..................... H01J 37/28 |
| | | 250/307 |
| 9,666,405 B1 * | 5/2017 | Lanio ..................... H01J 37/244 |
| 9,741,532 B1 * | 8/2017 | Bedell ..................... H01J 37/28 |
| 10,468,230 B2 * | 11/2019 | Lavely ............... G01N 23/2251 |

(Continued)

FOREIGN PATENT DOCUMENTS

| WO | 2018041696 | 3/2018 |
| WO | 2019238553 | 12/2019 |

OTHER PUBLICATIONS

EP20164231.1, Extended European Search Report, dated Sep. 15, 2020, 9 pages.

*Primary Examiner* — David A Vanore

(57) ABSTRACT

The invention relates to system and method of inspecting a specimen with a plurality of charged particle beamlets. The method comprises the steps of providing a specimen, providing a plurality of charged particle beamlets and focusing said plurality of charged particle beamlets onto said specimen, and detecting a flux of radiation emanating from the specimen in response to said irradiation by said plurality of charged particle beamlets.

18 Claims, 5 Drawing Sheets

(56) References Cited

U.S. PATENT DOCUMENTS

| | | | |
|---|---|---|---|
| 2009/0014649 A1* | 1/2009 | Nakasuji | H01J 37/153 250/310 |
| 2010/0320382 A1* | 12/2010 | Almogy | H01J 37/05 250/311 |
| 2011/0272576 A1* | 11/2011 | Otaki | B82Y 40/00 250/306 |
| 2015/0090879 A1* | 4/2015 | Zeidler | H01J 37/28 250/311 |
| 2015/0270095 A1* | 9/2015 | Kruit | H01J 37/3177 250/311 |
| 2015/0279615 A1* | 10/2015 | Potocek | H01J 37/261 250/306 |
| 2016/0054240 A1* | 2/2016 | Uncovsky | H01J 37/244 250/307 |
| 2017/0131536 A1* | 5/2017 | Potocek | G02B 21/365 |
| 2017/0133198 A1* | 5/2017 | Kruit | H01J 37/141 |
| 2019/0066972 A1* | 2/2019 | Frosien | H01J 37/3177 |
| 2019/0259575 A1* | 8/2019 | Sarov | H01J 37/045 |
| 2019/0378681 A1* | 12/2019 | Stejskal | H01J 37/244 |
| 2019/0393013 A1* | 12/2019 | Sed'a | H01J 37/1474 |
| 2020/0035447 A1* | 1/2020 | Kruit | H01J 37/228 |
| 2020/0051779 A1* | 2/2020 | Ren | H01J 37/04 |
| 2020/0211810 A1* | 7/2020 | Zeidler | H01J 37/04 |
| 2020/0273667 A1* | 8/2020 | Mohammadi-Gheidari | H01J 37/12 |
| 2020/0312610 A1* | 10/2020 | Hlavenka | H01J 37/20 |
| 2021/0296088 A1* | 9/2021 | Stejskal | H01J 37/244 |

* cited by examiner

CHARGED PARTICLE BEAM DEVICE FOR INSPECTION OF A SPECIMEN WITH A PLURALITY OF CHARGED PARTICLE BEAMLETS

SUMMARY

The invention relates to a method of inspecting a specimen with a plurality of charged particle beamlets, the method comprising the steps of providing a specimen, providing a plurality of charged particle beamlets and focusing said plurality of charged particle beamlets onto said specimen, and detecting a flux of radiation emanating from the specimen in response to said irradiation by said plurality of charged particle beamlets. The invention also relates to a charged particle beam device for carrying out this method.

DETAILED DESCRIPTION

Figure 1:
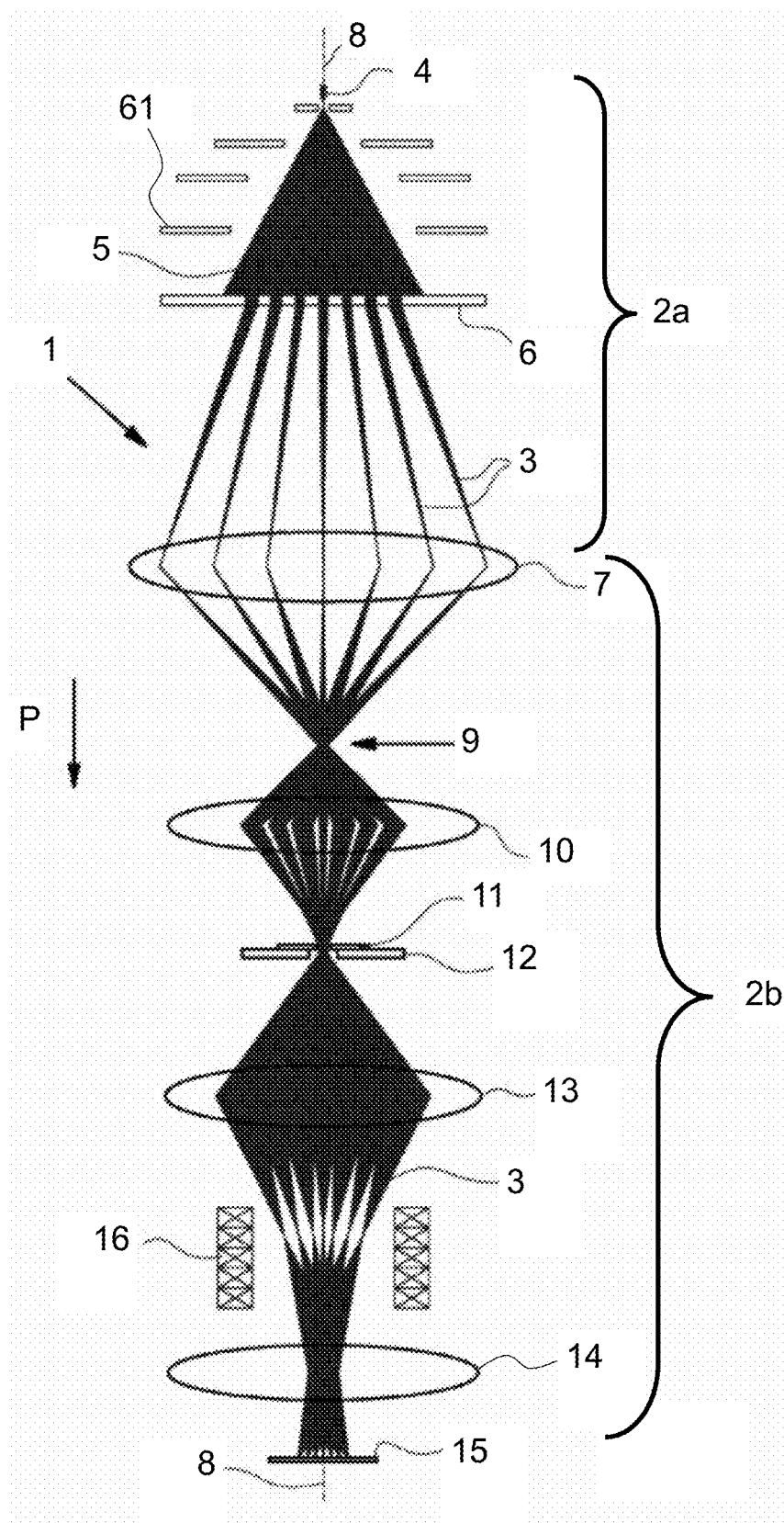
FIG. 1—renders a longitudinal cross-sectional elevation view of a first embodiment of an electron microscope.

MultiBeam Scanning Electron Microscope (MBSEM) may inspect a specimen with a plurality of charged particle beamlets. MBSEM may utilize a so-called multi-column or multi-beam approach. In the multi-column approach a plurality of electron sources are provided for generating a corresponding plurality of electron beams. In the multi-beam approach a single electron source is used for generating a plurality of electron beams. The basic idea behind the simultaneous use of several primary beams—as opposed to just a single beam—is that it promises significant throughput improvement, since the use of an array of beams allows parallel imaging. However, the concurrent use of multiple imaging beams also presents various technical problems and challenges. One of these challenges lies in providing a detection path for the multiple imaging beams and distinguishing between signals emanating from different beamlet spots.

It is an object of the invention to provide an improved method of inspecting a specimen with a plurality of charged particle beamlets.

To this end, the invention provides a method as defined in claim 1. According to this method, said plurality of charged particle beamlets are focused onto said specimen into a beamlet pattern, wherein said beamlet pattern comprises a plurality of spaced apart beamlet spots, and wherein said beamlet spots are spaced apart in a first direction and comprise an inter-beamlet spot distance between adjacent beamlet spots. The beamlet pattern may, in an embodiment, be a substantially one-dimensional row of spaced apart beamlet spots. A two-dimensional array of beamlet spots is conceivable as well, as this array comprises a one-dimensional row of spaced apart beamlet spots as well.

According to the present disclosure, the method comprises the step of moving said beamlet pattern in said first direction and over a distance that exceeds said inter-beamlet spot distance. According to the method, the beamlet pattern is moved to a plurality of mutually different beamlet pattern positions and corresponding fluxes of radiation at said plurality of distinct beamlet pattern positions are measured.

The specimen may contain a plurality of mutually different regions, wherein each region exhibits similar characteristics, and different regions comprise different characteristics. For example, the sample may be a granular sample having a plurality of different grains. Each grain may have a different structure, crystal orientation, phase of material, elemental composition and/or different Z. The sample may, alternatively, be non-granular as well, having a plurality of regions that comprise different inter-region characteristics, wherein preferably at least one intra-region characteristic is substantially constant. Regions are bounded by region boundaries.

For these specimens, the beamlet pattern may be moved from a first region, over a region boundary, to a second adjacent region having different characteristics. Beamlet spots of the beamlet pattern are moved from this first region to a second region as well. Some of the beamlet spots are moved from the first region to the second region. Some of the beamlet spots may be moved within the first region alone. This allows a different number of beamlet spots of the beamlet pattern to be located in different regions in between successive measurements, changing the contribution of the different regions in the measured signal.

As defined herein, the detected fluxes for said mutually different beamlet pattern positions can be assigned to one or more specimen features. The specimen features may in particular be related to region features, such as grain features. In particular, the detected fluxes at multiple different beamlet pattern positions are processed and/or combined for defining one or more specimen features. For each beamlet pattern position a single flux can be detected. As there is some overlap between different beamlet pattern positions, the detected fluxes are interrelated to some amount. This can be leveraged in determining one or more specimen features.

The method as defined herein allows a very rapid and accurate determination of specimen features, in which it is possible to detect combined fluxes of said beamlet pattern, without the need for detecting individual fluxes. Hence no individual detectors for each particle beamlet are necessary. With this, the method as defined herein allows a rapid and accurate investigation of a sample using a plurality of charged particle beamlets in a relatively simple construction. With this, the goal of the invention is achieved.

Advantageous embodiments will be explained below.

In an embodiment, the method comprises the use of at least an electron backscatter diffraction (EBSD) technique. EBSD is a scanning electron microscope-based microstructural-crystallographic characterization technique commonly used in the study of crystalline or polycrystalline materials. The technique can provide information about the structure, crystal orientation, phase, or strain in the material.

The method may comprise the step using at least an energy dispersive X-Ray spectroscopy technique. The X-ray spectroscopy technique may be energy dispersive X-ray spectroscopy (EDS) and/or wavelength dispersive X-ray spectroscopy (WDS).

The method may comprise a combined electron backscatter diffraction technique and an energy dispersive X-ray spectroscopy technique. A combination of EBSD and EDS and/or WDS can provide a deeper insight into the specimen's properties. For example, the minerals calcite (limestone) and aragonite (shell) have the same chemical composition—calcium carbonate (CaCO3). Therefore EDS/WDS cannot tell them apart, but they have different microcrystalline structures so EBSD can differentiate between them.

It is noted that the step of detecting may comprise at least one or more of the following techniques: a backscatter electrons detection technique, a secondary electrons detection technique, a cathodoluminescence technique, a STEM detection technique.

The method may comprise the step of moving the plurality of beamlet spots over at least one specimen feature, and reconstructing said specimen feature based on said detected fluxes. Said specimen feature may comprise a grain boundary, for example.

The beamlet pattern may comprise at least three beamlet spots.

The beamlet pattern may comprise an N×N or N×M array of beamlets. In that case a plurality of beamlet patterns are provided that are spaced apart in a second direction, substantially orthogonal to said first direction, for forming a 2D multi-beamlet array. The array may be square or rectangular.

In an embodiment, the 2D multi-beamlet array comprises at least nine beamlet spots. The beamlet spots may be arranged in a 3×3 array.

It is conceivable that the beamlet pattern is moved over said sample in a raster-like pattern, wherein said raster comprises points that are revisited by different beam spots during movement of the beamlet pattern. In an embodiment that speeds up the investigation of the sample, however, once a certain location is measured that location is preferably not revisited anymore by any of the beamlet spots of the beamlet pattern. The method may comprise in this case the step of moving said beamlet pattern over said sample in at least said first direction in such a way that beamlet spots of said beamlet pattern are substantially moved to unique sample locations. This speeds up the investigation of the sample and reduces sample damage.

It is conceivable that the method comprises the additional step of moving the beamlet pattern in a second direction, substantially orthogonal to said first direction so that a larger area of the sample may be investigated.

According to an aspect, a charged particle beam device for inspection of a specimen with a plurality of charged particle beamlets is provided. The charged particle beam device comprises a specimen holder for holding a specimen, a source for producing a beam of charged particles, an illuminator for converting said beam of charged particles into a plurality of charged particle beamlets and focusing said plurality of charged particle beamlets onto said specimen, wherein said plurality of charged particle beamlets are focused onto said specimen into a beamlet pattern. As defined herein, said beamlet pattern comprises a plurality of spaced apart beamlet spots, wherein said beamlet spots are spaced apart in a first direction and comprise an inter-beamlet spot distance between adjacent beamlet spots. A detector is provided for detecting a flux of radiation emanating from the specimen in response to said irradiation by said plurality of charged particle beamlets.

The charged particle beam device as defined herein is arranged for moving said beamlet pattern, in said first direction and over a distance that exceeds said inter-beamlet spot distance, to a plurality of mutually different beamlet pattern positions and detecting corresponding fluxes of radiation at said plurality of distinct beamlet pattern positions.

The charged particle beam device as defined herein is further arranged for assigning said detected fluxes for said mutually different beamlet pattern positions to one or more specimen features. As indicated above, said specimen features may be related to region features, such as grain features.

In an embodiment, the charged particle beam device comprises a controller, wherein said controller is arranged for executing, with said charged particle beam device, the method as defined herein. Advantages of such a device and method have been elucidated above.

According to an aspect, a non-transitory computer readable medium (CRM) is provided, wherein said CRM has stored thereon software instructions that, when executed by a processor, cause the processor to generate control signals for controlling a charged particle beam device to execute the method as defined herein.

Turning to FIG. 1, FIG. 1 shows an example of a charged particle beam device, in the form of a Multi-Beam Scanning Electron Microscope (MBSEM). The MBSEM 1 comprises a multi beam charged particle generator 2a for generating an array of primary charged particle beams 3, in this case an array of primary electron beams 3. The multi beam electron generator 2a comprises at least one electron source 4 for generating a diverging electron beam 5. The diverging electron beam 5 is split into an array of focused primary electron beams 3 by an aperture lens array 6. The primary electron beams 3 are subsequently directed towards a sample 15, as schematically indicated by the arrow P. The sample can be positioned on a stage, so that it can be positioned in a desired manner with respect to the charged particle beamlets 3.

The multiple images of the source 4 are positioned on the object principle plane of an accelerator lens 7. The accelerator lens 7 directs the primary electron beams 3 towards the optical axis 8 and creates a first common cross-over 9 of all the primary electron beams 3.

The first common cross-over 9 is imaged by the magnetic condenser lens 10 onto a variable aperture 11 that acts as a current limiting aperture. At the variable aperture 11 a second common cross-over of all the primary electron beams 3 is created.

The MBSEM comprises a lens system 13, 14 for directing the primary charged particle beams from the common cross-over at the variable aperture 11 towards the sample surface 15 and for focusing all primary charged particle beams 3 into an array of individual spots on the sample surface 15. The lens system comprises an intermediate magnetic lens 13 for imaging the variable aperture 11 onto a coma free plane of the objective lens 14, which objective lens 14 creates an array of focused primary electron beams on the sample surface 15.

In addition the MBSEM is provided with scan coils 16 for scanning the array of focused primary electron beams over the sample surface 15.

The MBSEM shown in this embodiment is furthermore provided with a position sensitive secondary electron detector 12 positioned at least substantially in or near a plane comprising a common cross-over, in this case directly below the variable aperture 11. This secondary electron detection system 12 is arranged to acquire the individual secondary electron image of each single primary electron beam spot on the sample surface 15. This means, that when the sample surface 15 is scanned in this MBSEM 1, multiple images can be acquired at the same time in one single scan period.

The charged particle beam device 1 as shown in FIG. 1 is arranged for inspection of a specimen 15 with a plurality of charged particle beamlets 3. The charged particle beam device comprises a specimen holder 15 for holding a specimen; a source 4 for producing a beam 5 of charged particles; an illuminator 2b for converting said beam 5 of charged particles into a plurality of charged particle beamlets 3 and directing said plurality of charged particle beamlets 3 onto said specimen 15. As will be indicated with respect to further Figs, the charged particle beam device is arranged for focusing said plurality of charged particle beamlets onto specimen into a beamlet pattern. Said beamlet pattern comprises a plurality of spaced apart beamlet spots, wherein said beamlet spots are spaced apart in a first direction and comprise an inter-beamlet spot distance between adjacent beamlet spots. The illuminator 2b comprises, in the embodiment shown, a multi-aperture lens plate 6 having a plurality of apertures for defining the corresponding plurality of charged particle beamlets; as well as at least a first electrode 61 for generating an electrical field at a surface of the multi-aperture lens plate 6. The charged particle beam device comprises a detector 12 for detecting a flux of radiation emanating from the specimen 15 in response to said irradiation by said plurality of charged particle beamlets. It is noted that the general setup as shown here in FIG. 1 is known to those skilled in the art, for example from EP 2 864 997 B1, and modifications to this set up are known to those skilled in the art as well.

The charged particle device 1 as disclosed herein is arranged for moving said beamlet pattern, in said first direction and over a distance that exceeds said inter-beamlet spot distance, to a plurality of mutually different beamlet pattern positions and detecting corresponding fluxes of radiation at said plurality of distinct beamlet pattern positions. The charged particle device is further arranged for assigning said detected fluxes for said mutually different beamlet pattern positions to one or more specimen features. The charged particle device may comprise a controller that is arranged for performing the above steps of moving the beamlet pattern and assigning said detected fluxes. These features of the charged particle device 1 as disclosed herein will further be elucidated with respect to FIGS. 4-8.

Figure 2:
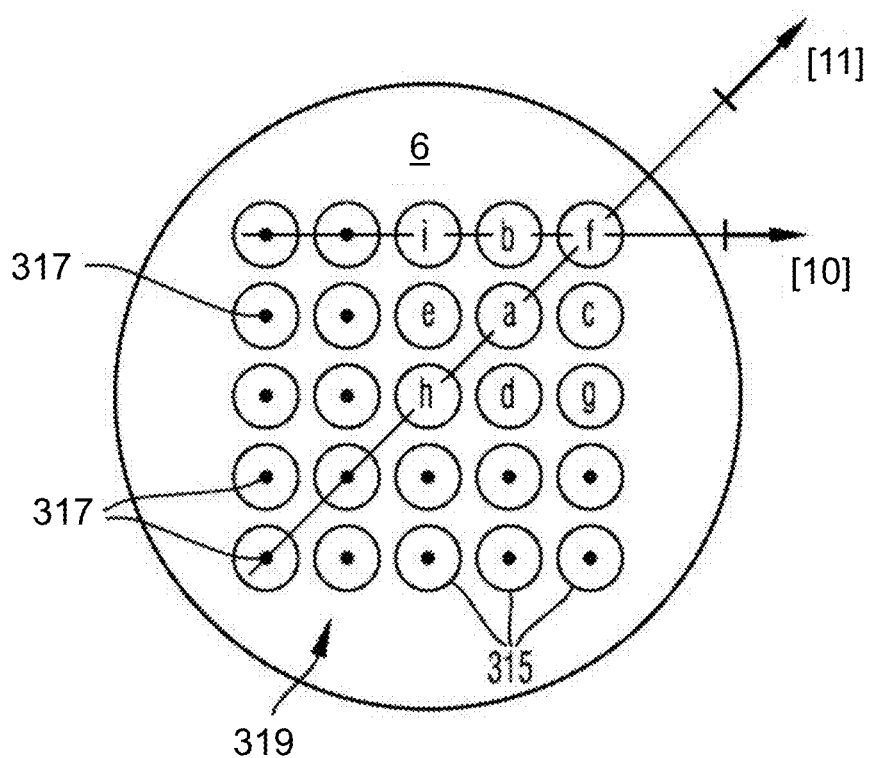
FIG. 2—illustrates a manner in which an electron beam array can be generated from a single progenitor beam.

Now first referring to FIG. 2, it is shown a regular grid 319 of N×N apertures 315 (where N=5) formed in a multi-aperture plate 6. Each non-peripheral aperture, or central aperture, "a" has four directly neighbouring apertures "b", "c", "d" and "e", and it has four second closest neighbouring apertures, or diagonally neighbouring, "f", "g", "h" and "i". FIG. 2 indicates a basic array vector [10], corresponding to a first direction [10], in which apertures 315 are arrayed at the closest neighbour pitch, and FIG. 2 indicates a basic array vector [11] in which the apertures 315 are arrayed with a second closest neighbour pitch. Each aperture has a center 317. The apertures shown here are arranged in a 5×5 matrix, having external apertures i, b, f, c, g positioned on a contour or edge of the grid, and internal apertures e, a, h, d positioned within an interior of the grid. Using such an aperture plate 6, a convoluted mix of BSEs is detected in case conventional BSE detection architecture is used. At present, there exists a challenge in backscattered electron detection, especially in these multi-beamlet devices, in correctly assigning detected backscattered electrons to the corresponding beamlet.

Figure 3:
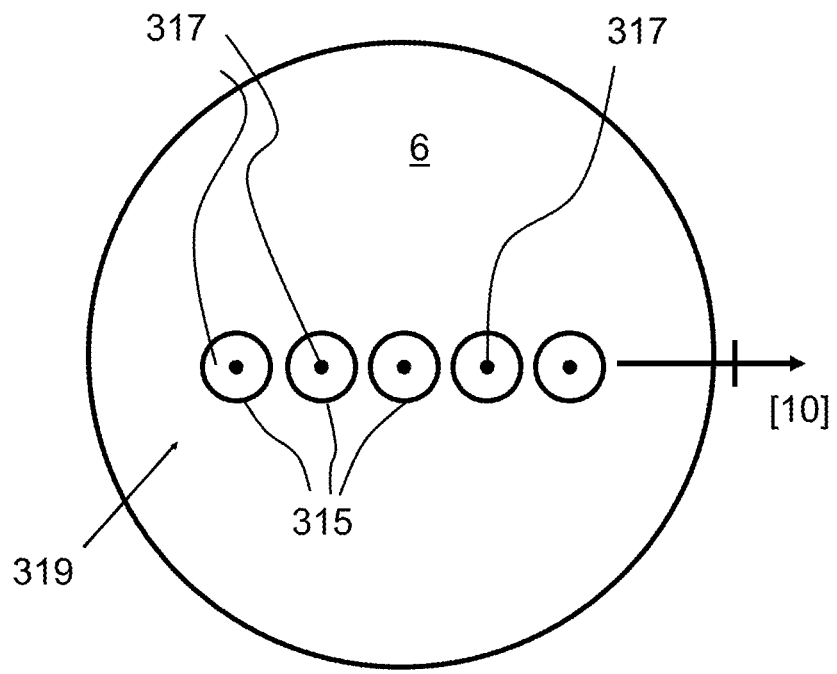
FIG. 3—illustrates a manner in which a 1D pattern of a plurality of charged particle beamlets can be generated.

FIG. 3 shows a setup according to an embodiment of the disclosure. Here, the multi-aperture plate 6 comprises a plurality of apertures 315 that are arranged to form a line. With the multi-aperture plate 6 the charged particle beam device is able to direct said plurality of charged particle beamlets onto said specimen in an essentially 1D pattern, in this case in the form of a straight line in line with array vector [10]. This allows the plurality of charged particle beamlets 3 to be focused onto said specimen 15 into a beamlet pattern, wherein said beamlet pattern comprises a plurality of spaced apart beamlet spots, and wherein said beamlet spots are spaced apart in a first direction [10] and comprise an inter-beamlet spot distance between adjacent beamlet spots.

Figure 4:
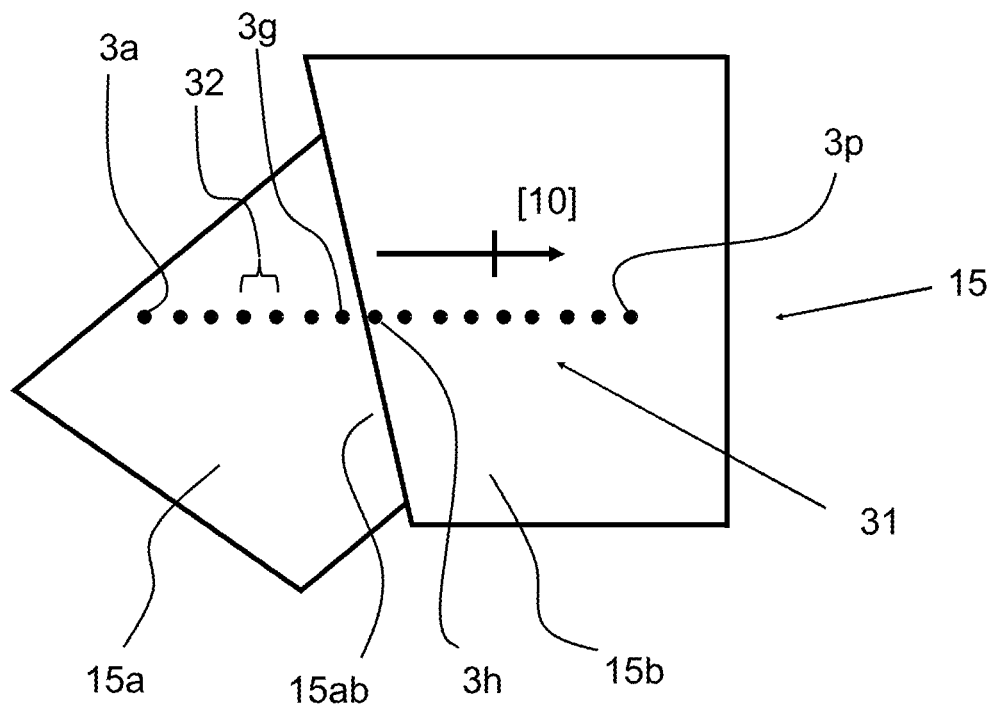
FIG. 4—illustrates illumination of a sample with a 1D pattern of beamlets in a first position.

FIG. 4 shows an example of such a beamlet pattern 31 provided on a sample surface 15 having two regions 15a and 15b that are divided by a region boundary 15ab. The beamlet pattern 31 shown here comprises a total of sixteen beamlet spots 3a . . . 3p (where only some of the beamlet spots have been provided with a reference sign for reasons of intelligibility). Here, the plurality of charged particle beamlets 3 are thus focused onto said specimen 15 into a beamlet pattern 31, wherein said beamlet pattern 31 comprises a plurality of spaced apart beamlet spots 3a . . . 3b, and wherein said beamlet spots are spaced apart in a first direction [10] and comprise an inter-beamlet spot distance 32 between adjacent beamlet spots.

Figure 5:
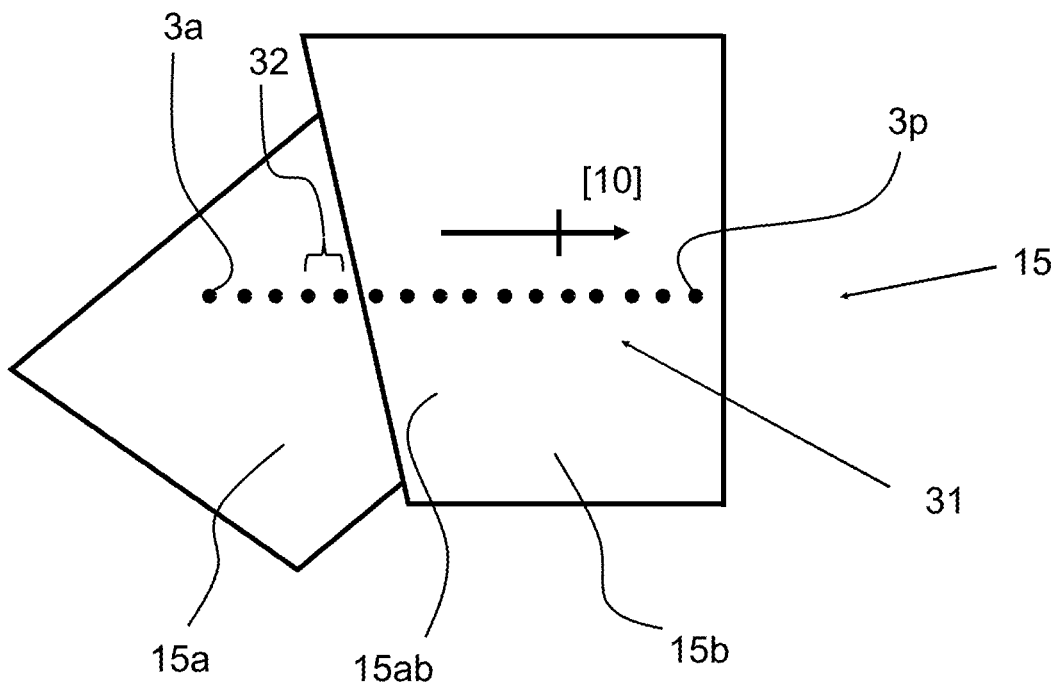
FIG. 5—illustrates illumination of a sample with the 1D pattern of beamlets of FIG. 4, in a second position.

Now, according to the method as defined herein, the beamlet pattern 31 is move, in said first direction [10] and over a distance that at least exceeds said inter-beamlet spot distance 32, to a plurality of mutually different beamlet pattern positions. FIG. 4 shows a first beamlet pattern position, and position 5 shows a second beamlet pattern position. It can be seen from FIG. 5 that the beamlet pattern 31 has moved in said first direction [10], i.e. from left to right, and that individual beamlet spots have moved as well. Now, in the first beamlet pattern position (FIG. 4), a total of seven beamlet spots are located within said first sample region 15a, and the remaining nine beamlet spots are located within said second sample region 15b. In the second beamlet pattern position (FIG. 5) a larger number of beamlet spots have moved onto the second sample region 15b. Here, a total of eleven beamlet spots are located on said second region 15b, and the remaining five beamlet spots are located within said first sample region 15a. During movement from the first beamlet position to the second beamlet position, the beamlet pattern is moved, in this example, over a distance that is equal to approximately two times the inter-beamlet spot distance 32. This is of course an example, and in principle any distance can be used as long as it exceeds the inter-beamlet spot distance 32. According to the method as defined herein, the flux of radiation is measured when the beamlet pattern is in the first position (FIG. 4) and the flux of radiation is also measured when the beamlet pattern is in the second position (FIG. 5). With the measured corresponding fluxes of radiation at said plurality of distinct beamlet pattern positions, it becomes possible to assign the detected fluxes for said mutually different beamlet pattern positions to one or more specimen features. In this case, it will be possible to assign one or more properties of the sample regions 15a, 15b for example, or one or more properties of the sample region boundary 15ab.

Consider, as an example, that the specimen 15 shown in FIG. 4 and FIG. 5 is a granular sample having a first grain 15a and a second grain 15b. The grains possess different grain characteristics that can be measured with the method as defined herein. In the situation depicted in FIG. 4 the EBSD pattern (or EDS spectrum) is ideally the same for all beamlet spots 3a-3g hitting the first grain 15a. Similarly, the EBSD pattern (or EDS spectrum) is ideally the same for all beamlet spots 3*h*-3*p* hitting the second grain 15*b*. This means that the signal collected by one or more detectors at this beamlet pattern position is composed, in principle, of only two different components instead of sixteen different components. During scanning the number of beamlets 3 which are hitting a given grain 15*a*, 15*b* is changing and consequently the signal intensity corresponding to a given EBSD pattern (or EDS spectrum) is changing as well. By appropriate signal and image postprocessing of the acquired merged signals and/or images (spectra) it is possible to reconstruct the EBSD (or EDS) map, thus assigning one or more specimen characteristics. The full analytical EBSD case can be further reduced to detection of channeling contrast using a very limited pixelated detector (e.g. a segmented BSE detector).

Figure 6:
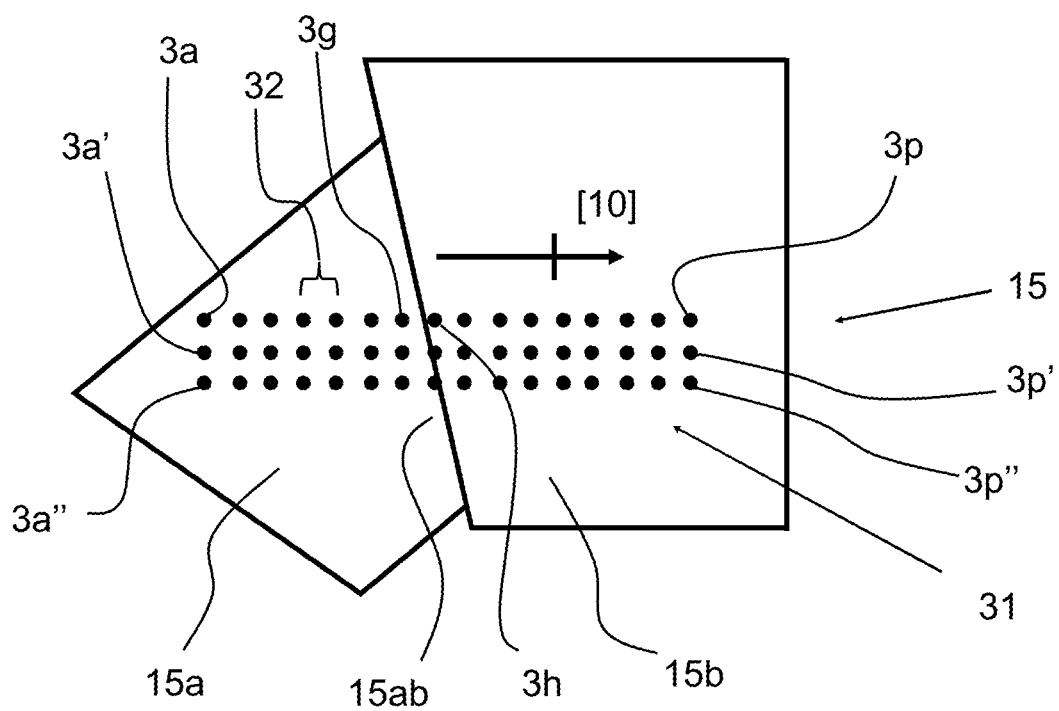
FIG. 6—illustrates illumination of a sample with a 2D pattern of beamlets.

FIG. 6 shows that the beamlet pattern 31 may comprise an N×M array of beamlet spots 3*a*-3*h*; 3*a*'-3*h*'; 3*a*"-3*h*". Here, a sixteen by three array of beamlet spots is used. The beamlet pattern is moved in the first direction [10] over at least the inter-beamlet spot distance 32, and corresponding signals at different positions are acquired. The signals can be processed to obtain information on the sample 15. It is of course possible that a different array of N×M beamlet spots is used. In principle, it is desirable to have at least three beamlet spots at an inter-beamlet spot distance so that moving the beamlet pattern from a first position to a second position changes the contribution of different sample regions to the detected signal. A regular N×N array, such as for example 3×3 is conceivable as well.

Once a certain part of the specimen is scanned by moving the beamlet pattern in the first direction, it is conceivable that remaining parts of the specimen are scanned by moving the beamlet pattern in a second direction, wherein said second direction has at least a component in a direction orthogonal to said first direction.

Figure 7:
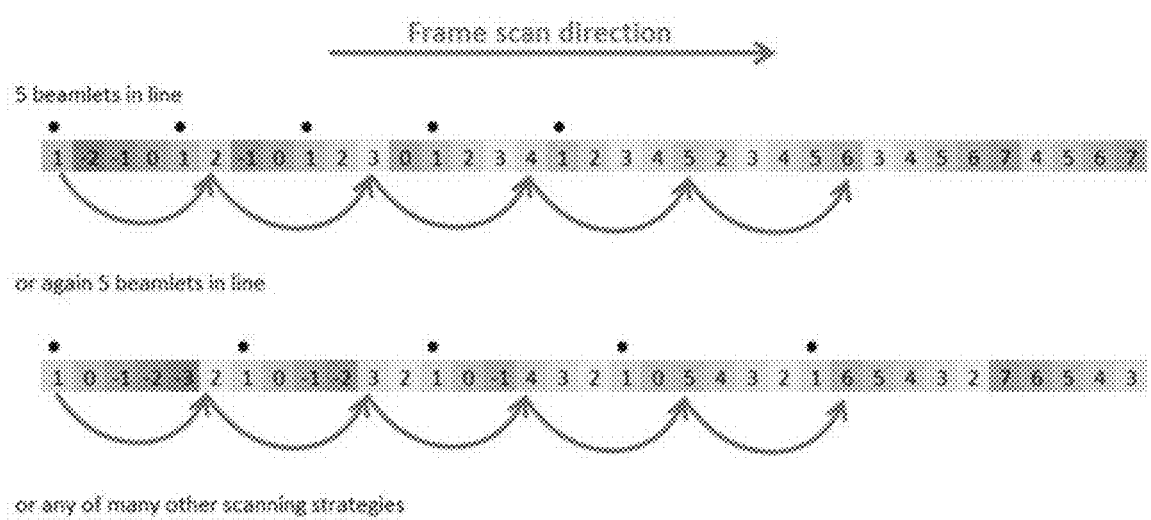
FIG. 7—illustrates possible scan patterns.

As an addition to the beamlet pattern described above, it is advantageous when certain dwell positions are only visited once by a single beamlet spot. To this end, one or more of the following scanning strategies may be used as shown in FIG. 7. The scanning strategy may depend on the distance between the beamlets and it would be designed in such a way that ideally no sample location is visited more than once by any beamlet and when crossing any grain boundary in line or frame scan direction there will be achieved sufficient spatial resolution (intensity variation from individual grains is detected with sufficient spatial resolution to enable accurate map reconstruction). There are plenty of useable scanning strategies, for instance see FIG. 7 with line beamlet pattern scanning strategies. In the top diagram, a total of five beamlets in line is shown, and each beamlet pattern position is indicated with a number. Here, the first beamlet pattern position is numbered "1", and it can be seen that the five beamlet spots are associated with this number "1". In the next beamlet position (i.e. number "2"), all of the beamlet spots are moved to the newly associated number (in this case "2"). It can be seen that the most left beamlet spot is moved just past the position taken by the second beamlet spot in the first beamlet pattern position, and so on. The inter-beamlet spot distance is maintained at the same distance. A flux of radiation is acquired and detected. Then, the beamlet pattern is moved once again to the next number ("3", "4", . . . "6") until the final beamlet pattern position ("7") is reached. So in the example in the top of FIG. 7, the beamlet pattern is moved, each time, over a distance that slightly exceeds the inter-beamlet spot distance.

In the bottom part of FIG. 7, a slightly different scanning strategy is used, wherein in each single step the beamlet pattern is moved over a distance that is slightly less than the inter-beamlet spot distance. However, in total the beamlet pattern is moved over a distance that exceeds the inter-beamlet spot distance, as in position "3" the first beamlet spot has moved past the second beamlet spot of the first beamlet pattern position (second beamlet spot from the left, associated with beamlet pattern position "1").

Figure 8:
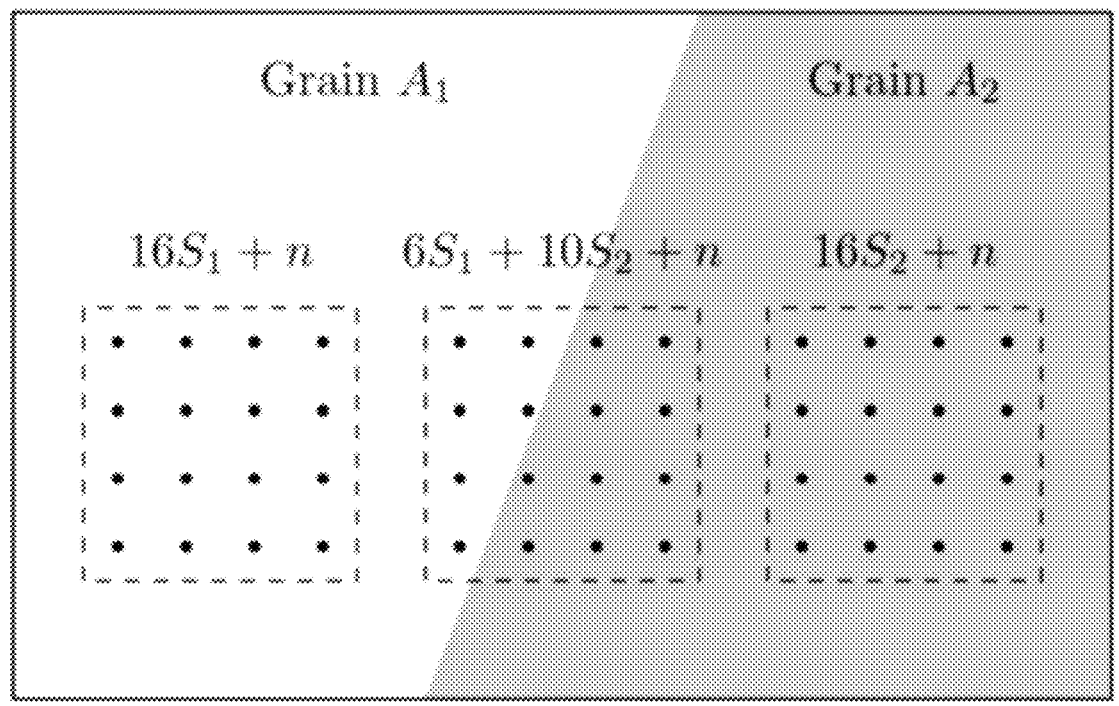
FIG. 8—illustrates illumination of a sample having two grains using a square beamlet pattern.

FIG. 8 shows an example of a beamlet pattern having a total of sixteen beamlet spots arranged in a four by four array. For positions completely within one grain we obtain a signal similar to single-beam. The grains can be identified from these signals. In order to reconstruct the edge of the grain a decomposition of the mixed signal is required. This can be done by first realizing how many probes are within each grain and then deciding which probes belong to what grain. Decomposition can be done by assuming that the mixed signal is composed only of a few clean noiseless signals that are assumed to be known. The signal noise can be attributed as well. With a successful decomposition we know how many probes are in which grain. Then reconstruction can be done, using additional assumptions if needed. For a granular structure of the specimen, it can be assumed that the grains are larger than the beamlet pattern. Consequently, the pixels with the same characteristics are most probably aggregated together. This information is sufficient to reconstruct the image. Appropriate method that utilize these properties could be interpolation, differential decision, rating and/or fitting.

Interpolation is a simple idea that can be used for overlapping multi-probe positions. If all probes within a single multi-probe position give the same signal then all pixels in between the probes (including the ones not covered by this multi-probe position) have the same characteristic (orientation).

Differential decision uses a comparison of two (or more) consecutive positions of overlapping multi-probes. Any difference between the two signals can be attributed to the outside of the overlapping region.

In rating, pixels are rated by neighbouring signals. We can then assign the characteristics to pixels with the highest ratings until all pixels are decided.

In fitting, a certain profile of the grain boundary is assumed and we can fit the acquired data to reconstruct the image.

The usability and effectivity of each type of method described above depends greatly on the type of multi-probe pattern that is used (i.e. grid pattern, or line of beamlet spots), the size thereof with respect to the sample regions (e.g. grains on the specimen), and on the scanning pattern. It is noted with respect to the size of the sample regions that in general it holds true that the bigger the regions (grains) the more successful the reconstruction can be.

Above, several embodiments have been discussed with respect to the accompanying Figs. The desired protection is determined by the appended claims.

The invention claimed is:

1. Method of inspecting a specimen with a plurality of charged particle beamlets, the method comprising the steps of:

Providing a specimen;

Providing a plurality of charged particle beamlets and focusing said plurality of charged particle beamlets onto said specimen;

Detecting a flux of radiation emanating from the specimen in response to said irradiation by said plurality of charged particle beamlets;

wherein said plurality of charged particle beamlets are focused onto said specimen into a beamlet pattern, wherein said beamlet pattern comprises a plurality of spaced apart beamlet spots, and wherein said beamlet spots are spaced apart in a first direction and comprise an inter-beamlet spot distance between adjacent beamlet spots;

Characterized in that the method comprises the steps of:

Moving said beamlet pattern, in said first direction and over a distance that exceeds said inter-beamlet spot distance, to a plurality of mutually different beamlet pattern positions and detecting corresponding fluxes of radiation at said plurality of distinct beamlet pattern positions;

Assigning said detected fluxes for said mutually different beamlet pattern positions to one or more specimen features.

2. Method according to claim 1, wherein a single flux is detected at each beamlet pattern position.

3. Method according to claim 2, further comprising decomposing the detected fluxes, and assigning said detected fluxes for said mutually different beamlet pattern positions to one or more specimen features based on the decomposition.

4. Method according to claim 3, wherein the detected fluxes are decomposed to determine a number of beamlet spots in a grain of the specimen at each beamlet pattern position.

5. Method according to claim 1, wherein detecting the flux of radiation emanating from the specimen includes detecting backscattered electrons.

6. Method according to claim 1, wherein detecting the flux of radiation emanating from the specimen includes detecting X-ray emanating from the specimen backscattered electrons and X-ray.

7. Method according to claim 1, wherein detecting the flux of radiation emanating from the specimen includes detecting both backscattered electrons and X-ray.

8. Method according to claim 1, comprising the step of moving the plurality of beamlet spots over at least one specimen feature, and reconstructing said specimen feature based on said detected fluxes.

9. Method according to claim 1, wherein said specimen feature comprises a grain boundary.

10. Method according to claim 1, wherein said beamlet pattern comprises at least three beamlet spots.

11. Method according to claim 1, comprising a plurality of beamlet patterns spaced apart in a second direction, substantially orthogonal to said first direction, for forming a 2D multi-beamlet array.

12. Method according to claim 11, wherein said 2D multi-beamlet array comprises at least nine beamlet spots.

13. Method according to claim 1, comprising the step of moving said beamlet pattern over said sample in at least said first direction in such a way that beamlet spots of said beamlet pattern are substantially moved to unique sample locations.

14. Method according to claim 1, comprising the step of moving the beamlet pattern in a second direction, substantially orthogonal to said first direction.

15. Method according to claim 1, wherein detecting a flux of radiation emanating from the specimen includes detecting at least one or more of backscattered electrons, secondary electrons cathodoluminescence.

16. A charged particle beam device for inspection of a specimen with a plurality of charged particle beamlets, the charged particle beam device comprising:

A specimen holder for holding a specimen;

A source for producing a beam of charged particles;

An illuminator for converting said beam of charged particles into a plurality of charged particle beamlets and focusing said plurality of charged particle beamlets onto said specimen, wherein said plurality of charged particle beamlets are focused onto said specimen into a beamlet pattern, wherein said beamlet pattern comprises a plurality of spaced apart beamlet spots, and wherein said beamlet spots are spaced apart in a first direction and comprise an inter-beamlet spot distance between adjacent beamlet spots;

A detector for detecting a flux of radiation emanating from the specimen in response to said irradiation by said plurality of charged particle beamlets;

a non-transitory computer readable medium for storing software instructions;

a controller, by executing the software instructions, with said charged particle beam device, the controller is configured to:

Move said beamlet pattern, in said first direction and over a distance that exceeds said inter-beamlet spot distance, to a plurality of mutually different beamlet pattern positions and detecting corresponding fluxes of radiation at said plurality of distinct beamlet pattern positions;

Assign said detected fluxes for said mutually different beamlet pattern positions to one or more specimen features.

17. The charged particle beam device according to claim 16, wherein at each of the beamlet pattern position, a combined flux of the beamlet pattern is detected by the detector.

18. The charged particle beam device according to claim 16, wherein the controller is further configured to: decompose the detected fluxes, and assign said detected fluxes for said mutually different beamlet pattern positions to one or more specimen features based on the decomposition.

* * * * *